United States Patent
Yosui et al.

(10) Patent No.: US 9,748,652 B2
(45) Date of Patent: Aug. 29, 2017

(54) MANUFACTURING METHOD FOR A MAGNETIC MATERIAL CORE-EMBEDDED RESIN MULTILAYER BOARD

(71) Applicant: Murata Manufacturing Co., Ltd., Nagaokakyo-shi, Kyoto-fu (JP)

(72) Inventors: Kuniaki Yosui, Nagaokakyo (JP); Naoki Gouchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 358 days.

(21) Appl. No.: 14/572,991

(22) Filed: Dec. 17, 2014

(65) Prior Publication Data
US 2015/0102970 A1 Apr. 16, 2015

Related U.S. Application Data

(63) Continuation of application No. PCT/JP2013/084193, filed on Dec. 20, 2013.

(30) Foreign Application Priority Data

Jan. 24, 2013 (JP) ................. 2013-011335

(51) Int. Cl.
*H01P 11/00* (2006.01)
*H01Q 13/00* (2006.01)
(Continued)

(52) U.S. Cl.
CPC ......... *H01Q 7/06* (2013.01); *G06K 19/07722* (2013.01); *G06K 19/07779* (2013.01);
(Continued)

(58) Field of Classification Search
CPC .... H01Q 7/06; H01Q 1/243; G06K 19/07722; G06K 19/07749; G06K 19/07779;
(Continued)

(56) References Cited

U.S. PATENT DOCUMENTS

| | | | | |
|---|---|---|---|---|
| 5,396,698 A | * | 3/1995 | Orthmann | H01Q 7/06 29/600 |
| 7,570,223 B2 | * | 8/2009 | Herzer | B82Y 25/00 343/787 |
| 9,397,401 B2 | * | 7/2016 | Koujima | G06K 19/07749 |

FOREIGN PATENT DOCUMENTS

| | | |
|---|---|---|
| JP | 4218635 B2 | 2/2009 |
| JP | 2009-130446 A | 6/2009 |

(Continued)

OTHER PUBLICATIONS

Official Communication issued in International Patent Application No. PCT/JP2013/084193, mailed on Apr. 1, 2014.
(Continued)

Primary Examiner — Donghai D Nguyen
(74) Attorney, Agent, or Firm — Keating & Bennett, LLP

(57) ABSTRACT

An antenna device includes a resin multilayer board in which a plurality of resin sheets are stacked, and a coil conductor provided in the resin multilayer board. A plurality of line portions of the coil conductor are provided on a lower surface of the resin sheet. When a magnetic material core is preliminarily pressure-bonded to the resin sheet, the magnetic material core is fractured along the line portions and cracks occur. Thus, the resin sheet with the magnetic material core in which the cracks have been formed is fully pressure-bonded together with the other resin sheets.

6 Claims, 10 Drawing Sheets

(51) Int. Cl.
  *H01Q 7/06* (2006.01)
  *H01Q 1/24* (2006.01)
  *G06K 19/077* (2006.01)
  *H05K 1/16* (2006.01)
  *H05K 3/44* (2006.01)
  *H05K 3/46* (2006.01)
  *H05K 1/02* (2006.01)

(52) U.S. Cl.
  CPC ............ *H01Q 1/243* (2013.01); *H05K 1/165* (2013.01); *H05K 3/44* (2013.01); *G06K 19/07794* (2013.01); *H05K 1/0239* (2013.01); *H05K 3/4602* (2013.01); *H05K 3/4617* (2013.01); *H05K 2201/086* (2013.01); *H05K 2201/10098* (2013.01); *H05K 2203/0278* (2013.01); *H05K 2203/063* (2013.01); *H05K 2203/1131* (2013.01); *Y10T 29/49016* (2015.01)

(58) Field of Classification Search
  CPC .... G06K 19/07794; H05K 3/44; H05K 1/165; H05K 2203/1131; H05K 3/4602; H05K 3/4617; H05K 2201/086; H05K 2201/10098; H05K 2203/0278; H05K 2203/063; H05K 1/0239; Y10T 29/49016; Y10T 29/49126; Y10T 29/49128
  USPC ......... 29/600, 602.1, 830, 831, 846; 336/83; 343/787
  See application file for complete search history.

(56) References Cited

FOREIGN PATENT DOCUMENTS

| | | |
|---|---|---|
| JP | 2010-123879 A | 6/2010 |
| JP | 2011-114853 A | 6/2011 |

OTHER PUBLICATIONS

Official Communication issued in Japanese Patent Application No. JP 2014-531443, mailed on Oct. 21, 2014.

* cited by examiner

FIG.5A
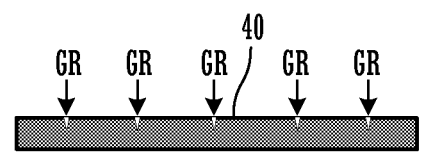
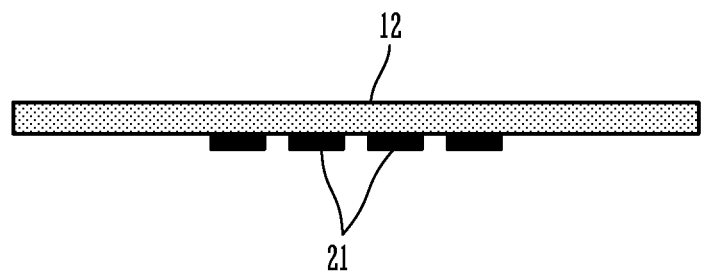
FIG.5B
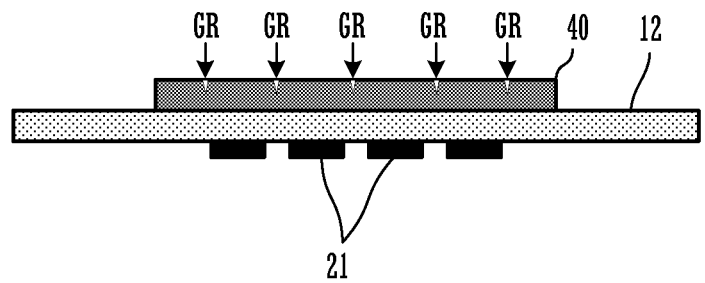

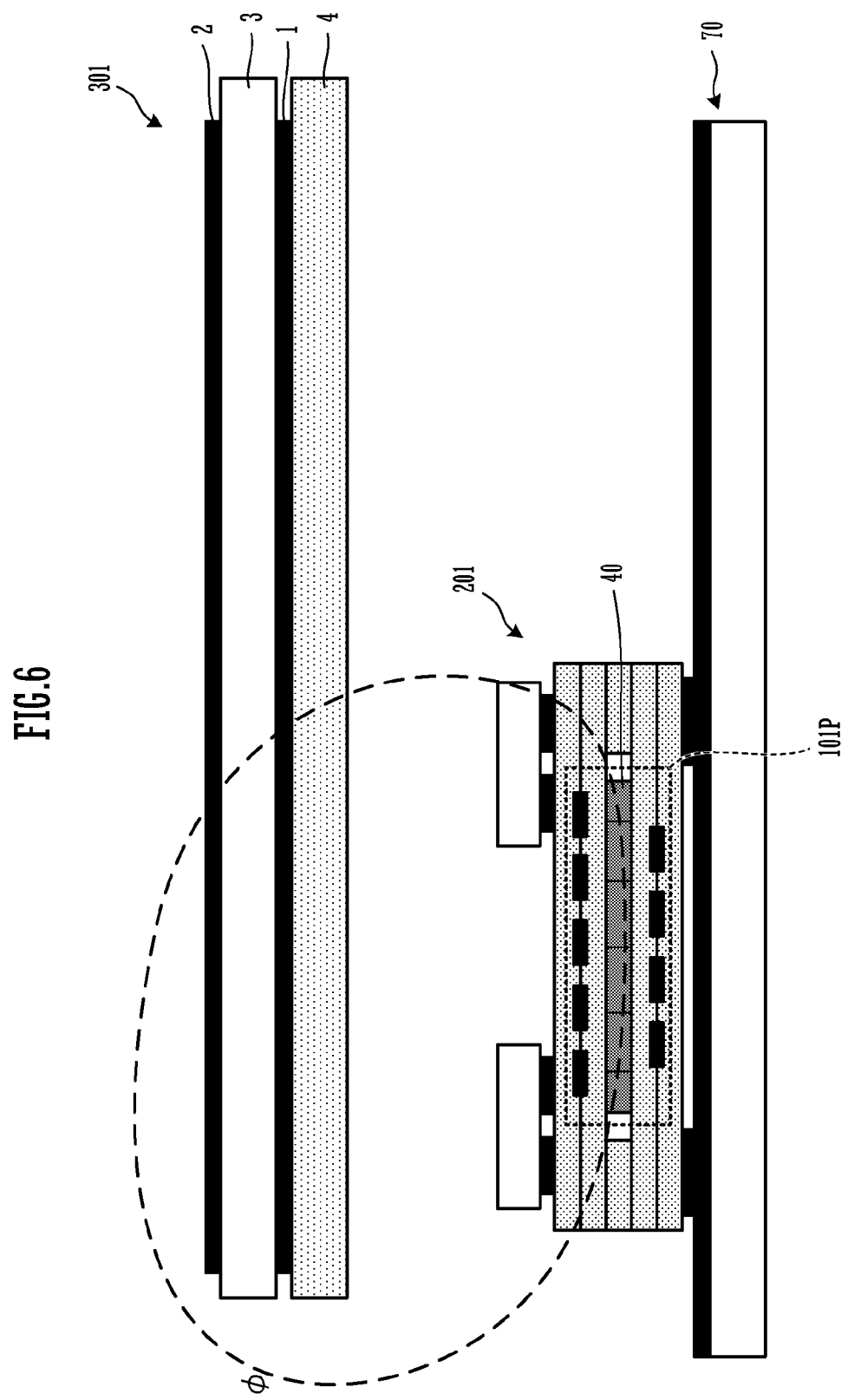

MANUFACTURING METHOD FOR A MAGNETIC MATERIAL CORE-EMBEDDED RESIN MULTILAYER BOARD

BACKGROUND OF THE INVENTION

1. Field of the Invention

The present invention relates to a resin multilayer board including a magnetic material core embedded therein, a manufacturing method therefor, and an electronic device including a magnetic material core-embedded resin multilayer board.

2. Description of the Related Art

Japanese Patent No. 4218635 discloses an antenna device that includes a magnetic material and is used in an RFID system that performs data communication in a non-contact manner.

FIG. 10 is a cross-sectional view of an antenna-integrated magnetic sheet disclosed in Japanese Patent No. 4218635. In FIG. 10, an antenna-integrated magnetic sheet 81 includes, in a sheet substrate 84, an antenna pattern 82 and magnetic material solid pieces 90 that are sintered bodies. In Japanese Patent No. 4218635, since the magnetic material is placed within the sheet substrate in a state of being formed into small pieces, deterioration of characteristics caused due to occurrence of a structural defect such as a crack, a chip, a fracture, or the like in the magnetic material is prevented.

In the case where a component including a magnetic material core such as a coil antenna including a magnetic material core is configured, it is conceivable that the magnetic material core is embedded in a resin multilayer board. In order to provide a magnetic material core having high magnetic characteristics, it is important to use a sintered magnetic material. However, a crack, a chip, a fracture, or the like is likely to occur in the magnetic material core in a pressure-bonding step during manufacture of the resin multilayer board. If such a structural defect occurs in the magnetic material core, magnetic characteristics deteriorate, and vary depending on the state of the defect.

Thus, also in the case where a magnetic material core is embedded in a resin multilayer board, it is conceivable that a magnetic material previously formed into small pieces is embedded within the resin multilayer board as disclosed in Japanese Patent No. 4218635. However, in order to embed the magnetic material in the form of small pieces in the resin multilayer board, a step of attaching a large number of magnetic materials, in the form of small pieces, to a resin sheet is necessary, which is industrially problematic.

SUMMARY OF THE INVENTION

Therefore, preferred embodiments of the present invention provide a magnetic material core-embedded resin multilayer board and a manufacturing method therefore that are able significantly reduce or prevent deterioration and variations of magnetic characteristics caused due to occurrence of an unexpected and unintended structural defect, without increasing the number of steps; and an electronic device including a magnetic material core-embedded resin multilayer board.

A magnetic material core-embedded resin multilayer board according to a preferred embodiment of the present invention is a resin multilayer board in which a plurality of resin sheets are stacked. A cavity is provided within the resin multilayer board, and a magnetic material core that is a sintered body is disposed within the cavity. A conductor pattern is provided on a resin sheet that directly faces the magnetic material core or on a resin sheet that indirectly faces the magnetic material core via another resin sheet. The magnetic material core is fractured along a portion of the conductor pattern.

Preferably, the magnetic material core is not fractured at a position other than a position along the conductor pattern.

The conductor pattern is, for example, a line portion defining a portion of a coil antenna.

An electronic device according to another preferred embodiment of the present invention includes the above-described magnetic material core-embedded resin multilayer board and a housing in which the magnetic material core-embedded resin multilayer board is disposed.

A manufacturing method for the magnetic material core-embedded resin multilayer board according to a further preferred embodiment of the present invention includes a preliminary pressure-bonding step of preliminarily pressure-bonding a magnetic material core, which is a sintered body, to at least one resin sheet to form a magnetic material core-equipped resin sheet; and a full pressure-bonding step of stacking a plurality of resin sheets including a resin sheet having a conductor pattern formed thereon, a resin sheet having an aperture formed therein, and the magnetic material core-equipped resin sheet, in a state where the magnetic material core is disposed in a cavity formed by the aperture, and fully pressure-bonding the plurality of resin sheets. In the preliminary pressure-bonding step or the full pressure-bonding step, a crack is formed in the magnetic material core along a conductor pattern formed on a resin sheet that directly faces the magnetic material core or on a resin sheet that indirectly faces the magnetic material core via another resin sheet.

The manufacturing method preferably includes a crack positioning step of decreasing a thickness of the magnetic material core at a position where the crack is to be formed, before the preliminary pressure-bonding step or the full pressure-bonding step.

According to various preferred embodiments of the present invention, since the magnetic material core is fractured along the conductor pattern, that is, an unexpected and unintended structural defect has not occurred therein, a step of attaching a large number of magnetic materials in the form of small pieces to a resin sheet is unnecessary, and the manufacturing cost is not increased. In addition, it is possible to provide a stable magnetic material core-embedded resin multilayer board that is able significantly reduce or prevent deterioration and variations of magnetic characteristics of the magnetic material core, and it is possible to provide an electronic device including the magnetic material core-embedded resin multilayer board.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is a cross-sectional view of a resin sheet 12 and a magnetic material core 40, FIG. 3B is a cross-sectional view in a state where the magnetic material core 40 is stacked on the resin sheet 12, and FIG. 3C is a cross-sectional view in a state where the magnetic material core 40 is preliminarily pressure-bonded to the resin sheet 12.

FIGS. 5A and 5B are diagrams showing the structure of a portion of the antenna device according to the second preferred embodiment and a manufacturing method therefor, wherein FIG. 5A is a cross-sectional view of a resin sheet 12 and the magnetic material core 40, and FIG. 5B is a cross-sectional view in a state where the magnetic material core 40 is stacked on the resin sheet 12.

FIG. 6 is a cross-sectional view of a principal portion of an antenna device according to a third preferred embodiment of the present invention.

DETAILED DESCRIPTION OF THE PREFERRED EMBODIMENTS

First Preferred Embodiment

Figure 1:
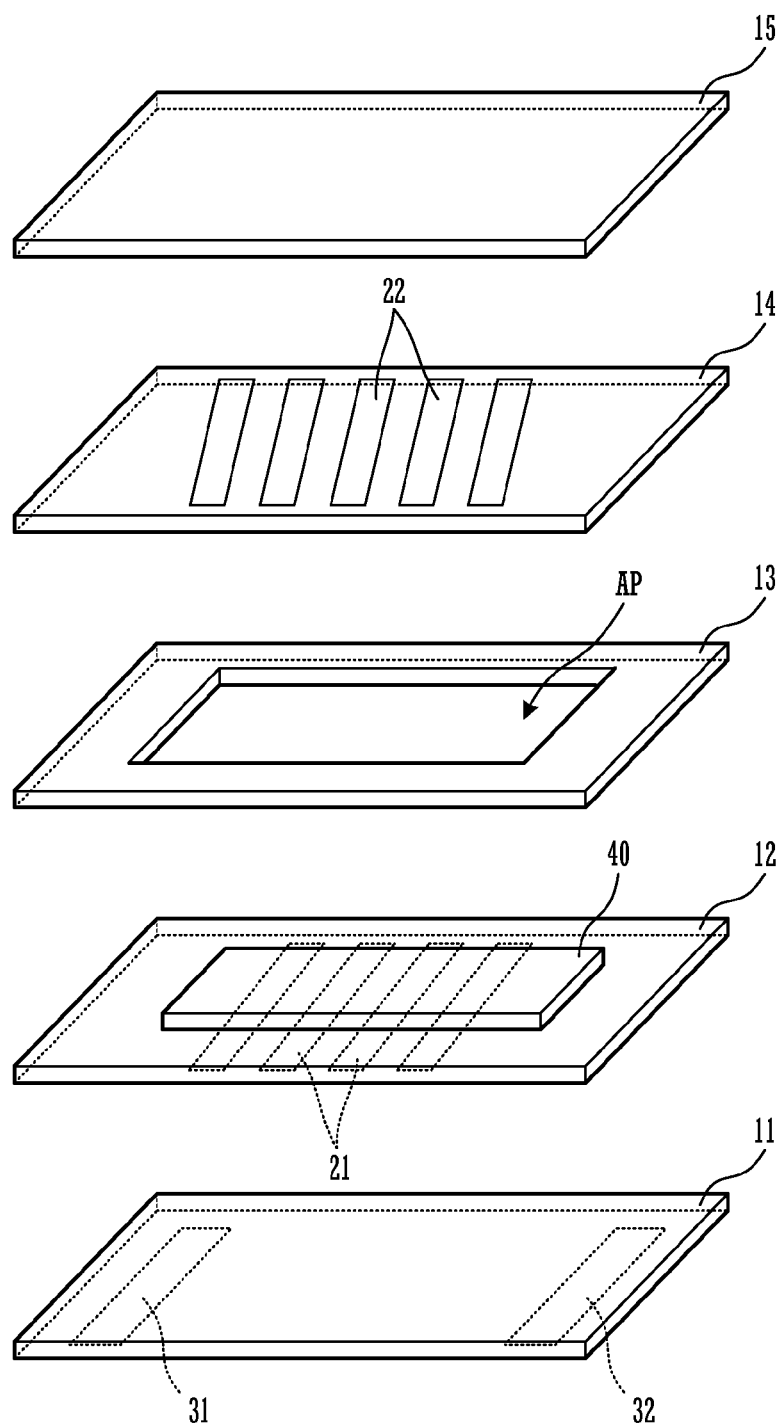
FIG. 1 is an exploded perspective view of an antenna device 101 according to a first preferred embodiment of a magnetic material core-embedded resin multilayer board of the present invention.
Figure 2A:
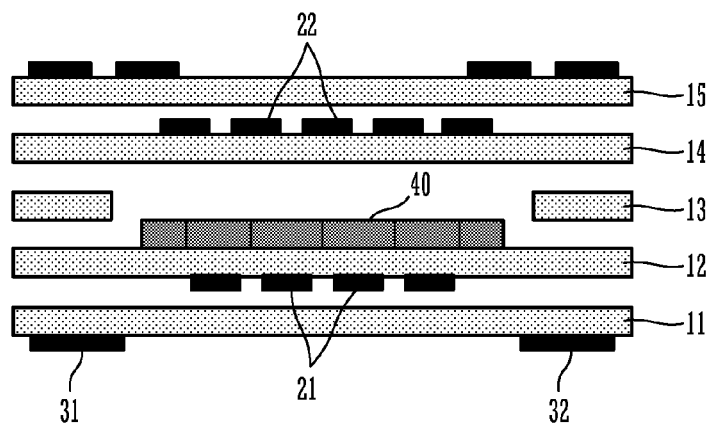
FIG. 2A is a cross-sectional view of the antenna device 101 before stacking.
Figure 2B:
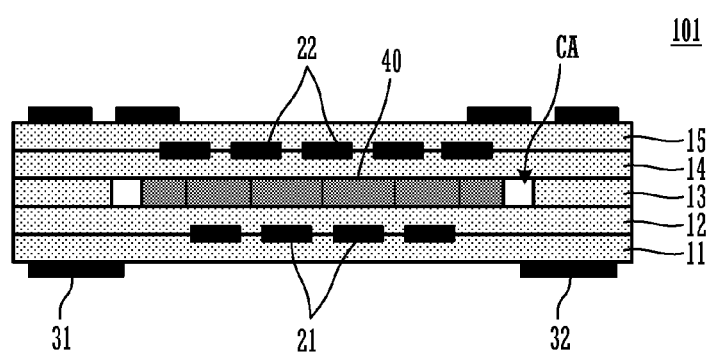
FIG. 2B is a cross-sectional view of the antenna device 101.
Figure 2C:
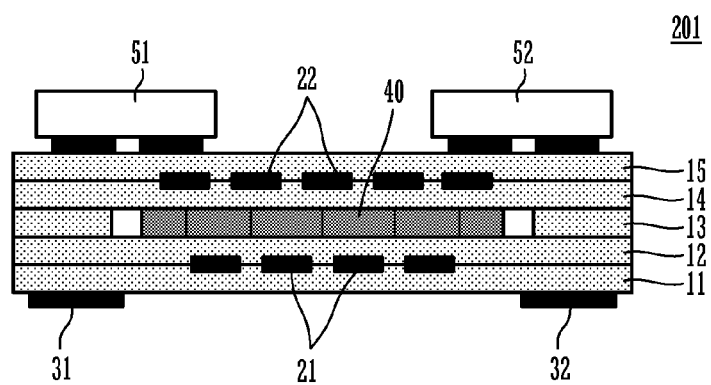
FIG. 2C is a cross-sectional view of an antenna module 201 configured by mounting chip components on the antenna device 101.

FIG. 1 is an exploded perspective view of an antenna device 101 according to a first preferred embodiment of a magnetic material core-embedded resin multilayer board of the present invention, FIG. 2A is a cross-sectional view of the antenna device 101 before stacking, FIG. 2B is a cross-sectional view of the antenna device 101, and FIG. 2C is a cross-sectional view of an antenna module 201 configured by mounting chip components on the antenna device 101. It should be noted that in FIGS. 1 and 2A to 2C, principal components related to various preferred embodiments of the present invention are shown, and illustration of the other components are partially omitted.

The antenna device 101 includes a resin multilayer board in which a plurality of resin sheets 11, 12, 13, 14, and 15 are stacked; and a coil conductor provided in the resin multilayer board. A plurality of line portions 21 of the coil conductor are provided on a lower surface of the resin sheet 12, and line portions 22 of the coil conductor are provided on an upper surface of the resin sheet 14. Mounting terminal electrodes 31 and 32 to which both ends of the coil conductor are respectively connected are provided on a lower surface of the resin sheet 11. A plurality of via-conductors (not shown in FIG. 1) of the coil conductor are provided in the resin sheets 12, 13, and 14. A helical coil conductor is defined by the line portions 21 and 22 and the via-conductors arranged so as to extend along a flattened square tube. The antenna device 101 further includes a magnetic material core 40 within a region where the coil conductor is provided, and the coil conductor and the magnetic material core 40 define a coil antenna.

An aperture AP is provided in a center portion of the resin sheet 14. A cavity CA is defined by the aperture AP, and the magnetic material core 40 is embedded within the cavity CA.

A conductor pattern other than the coil conductor is provided in the antenna device 101 as necessary. In the case where the coil conductor is merely connected to the outside, both ends of the coil conductor are connected to the terminal electrodes 31 and 32 through via-conductors provided in the resin sheet 11.

Figure 3A:
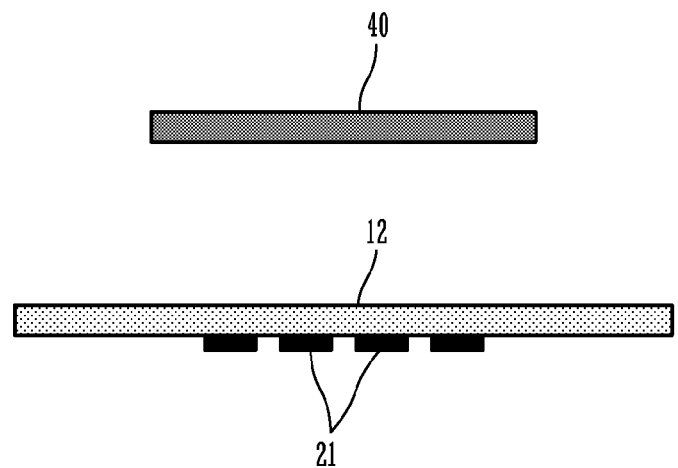
FIGS. 3A to 3C are diagrams showing the structure of the antenna device 101 and a manufacturing method therefor.
Figure 3B:
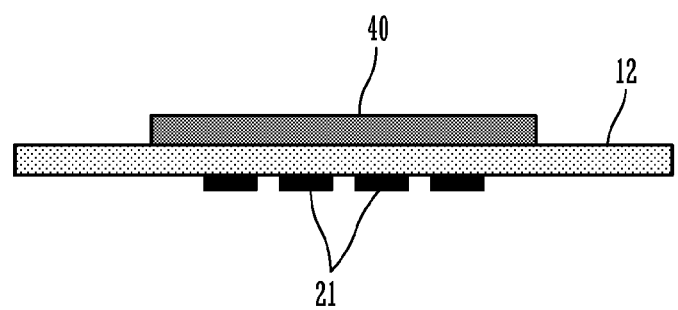
Figure 3C:
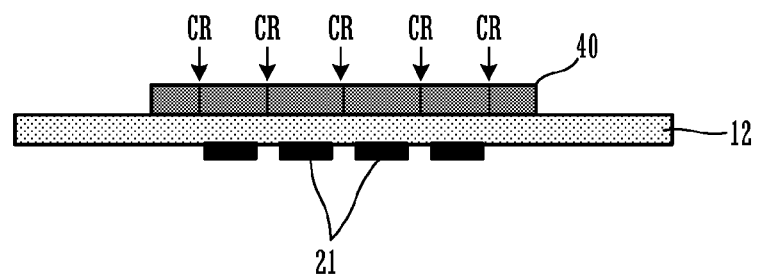

FIGS. 3A to 3C are diagrams showing the structure of the antenna device and a non-limiting example of a manufacturing method therefor, FIG. 3A is a cross-sectional view of the resin sheet 12 and the magnetic material core 40, FIG. 3B is a cross-sectional view in a state where the magnetic material core 40 is stacked on the resin sheet 12, and FIG. 3C is a cross-sectional view in a state where the magnetic material core 40 is preliminarily pressure-bonded to the resin sheet 12.

By preliminary pressure-bonding from the state shown in FIG. 3B, stress is applied to each portion of the magnetic material core 40. Since the line portions 21 (corresponding to a "conductor pattern") of the coil conductor are present on the lower surface of the resin sheet 12 at a position where the magnetic material core 40 overlaps in a plan view, due to pressure during the preliminary pressure-bonding, the line portions 21 define and serve as fulcrums and a plurality of cracks CR are formed in the magnetic material core 40 as shown in FIG. 3C.

The pressure applied during the preliminary pressure-bonding preferably satisfies a condition such that the magnetic material core 40 is not fractured at any position other than positions along the line portions 21. Thus, it is possible to form the magnetic material core into small pieces, as desired.

By stacking the resin sheet 12, to which the magnetic material core 40 in which the cracks CR have been formed has been preliminarily pressure-bonded as described above, as shown in FIGS. 2A and 2B and fully pressure-bonding (press-forming) the stacked body, the antenna device 101 is formed. Then, as shown in FIG. 2C, chip components 51 and 52 are mounted on the antenna device 101 to form the antenna module 201.

Since the magnetic material core 40 is intentionally formed into the small pieces along the line portions as described above, it is possible to significantly reduce or prevent deterioration and variations of magnetic characteristics caused due to the occurrence of unexpected structural defects during the preliminary pressure-bonding or the full pressure-bonding. In addition, since the magnetic material core 40 is formed into the small pieces during the preliminary pressure-bonding and the resin sheet to which the magnetic material core 40 formed into the small pieces has been attached is fully pressure-bonded together with the other resin sheets, a step of individually attaching a large number of magnetic material cores formed as small pieces to a resin sheet is unnecessary, and it is possible to reduce the manufacturing cost. Moreover, since the magnetic material core 40 formed into the small pieces are preliminarily pressure-bonded to the resin sheet 12, for example, even when transfer or the like is performed before the full pressure-bonding, the magnetic material core 40 does not easily come off of the resin sheet 12 or is not easily displaced relative to the resin sheet 12.

Second Preferred Embodiment

Figure 4:
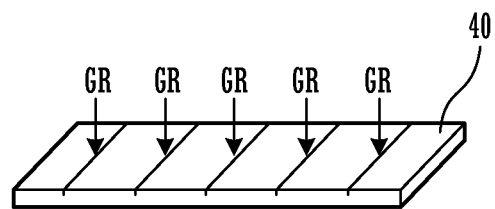
FIG. 4 is a perspective view of a magnetic material core 40 included in an antenna device according to a second preferred embodiment of the present invention.

FIGS. 4, 5A, and 5B are diagrams showing the structure of a portion of an antenna device according to a second preferred embodiment of the present invention and a non-limiting example of a manufacturing method therefor. FIG. 4 is a perspective view of the magnetic material core 40, FIG. 5A is a cross-sectional view of the resin sheet 12 and the magnetic material core 40, and FIG. 5B is a cross-sectional view in a state where the magnetic material core 40 is stacked on the resin sheet 12.

The manufacturing method for the antenna device of the second preferred embodiment includes a "crack positioning step" for predetermining positions at which cracks are to be formed in the magnetic material core. The magnetic material core 40 shown in FIGS. 4 and 5A includes a plurality of grooves GR. In a later step, cracks are formed (fractures occur) at the positions of the grooves GR. The grooves GR are formed preferably by forming grooves on an unsintered green sheet for the magnetic material core 40 by embossing; and sintering the green sheet. It should be noted that the grooves GR may be formed by half-cutting the sintered magnetic material core with a dicer or the like.

By performing preliminary pressure-bonding from the state shown in FIG. 5B, due to the pressure at that time, the line portions 21 define and serve as fulcrums and the magnetic material core 40 is fractured at the positions of the grooves GR.

By previously forming the grooves to decrease the thickness at the positions to be fractured as described above, it is possible to accurately set the sizes and the number of the respective small pieces of the magnetic material core.

Third Preferred Embodiment

FIG. 6 is a cross-sectional view of a principal portion of an antenna device according to a third preferred embodiment of the present invention. It should be noted that in this example, the antenna device is not merely an antenna device but is an antenna device configured with the antenna module 201 (i.e., including an antenna module). The antenna device includes the antenna module 201 and a booster coil 301. The configuration of the antenna module 201 is as described in the first preferred embodiment, and an antenna portion 101P within the antenna module 201 is preferably used as a feeding coil configured to couple with the booster coil 301.

Figure 7:
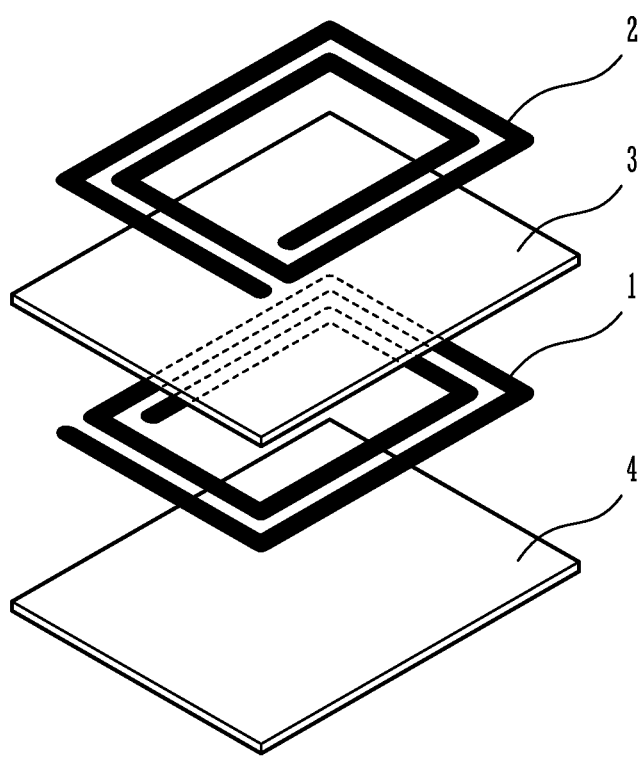
FIG. 7 is an exploded perspective view of a booster coil 301.

FIG. 7 is an exploded perspective view of the booster coil 301. The booster coil 301 includes an insulator substrate 3, a first coil 1 provided on a first surface of the insulator substrate 3, a second coil 2 provided on a second surface of the insulator substrate 3, and a magnetic material sheet 4. Each of the first coil 1 and the second coil 2 is a conductor patterned in a rectangular or substantially rectangular spiral shape, and is patterned so as to be capacitively coupled to each other in a state where a current flows therethrough in the same direction in a plan view. The two coil conductors are patterned such that when a current flows through one of the coil conductors in a clockwise direction in a plan view from the same direction, a current flows through the other coil conductor in the clockwise direction.

As shown by a magnetic flux φ in FIG. 6, the antenna portion 101P of the antenna module 201 and the booster coil 301 are disposed so as to be magnetically coupled to each other. The magnetic material sheet 4 is thin enough so as not to impede the magnetic coupling between the antenna portion 101P of the antenna module 201 and the booster coil 301. In addition, the magnetic material sheet 4 shields a magnetic field generated from the booster coil 301, to significantly reduce or prevent the occurrence of an eddy current in a ground conductor provided on a mounting board 70. It should be noted that the magnetic material sheet 4 may not necessarily be provided.

In addition, in the present preferred embodiment, the antenna device preferably including the antenna module 201 is shown, but may be provided without the antenna module. For example, the antenna device 101 and the booster coil 301 may be combined with each other.

Figure 8:
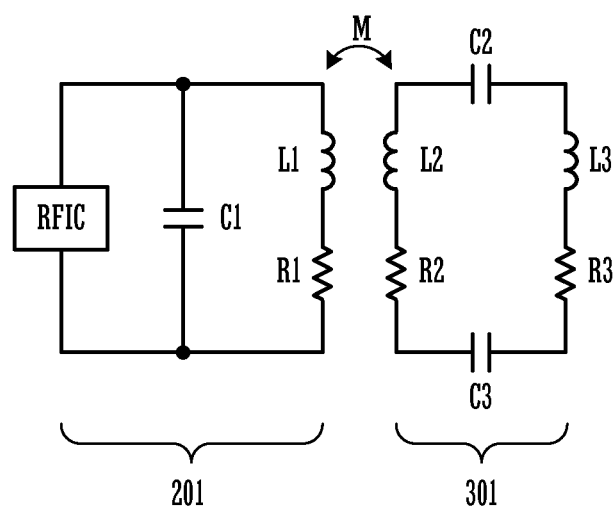
FIG. 8 is an equivalent circuit diagram of the antenna device shown in FIG. 6.

FIG. 8 is an equivalent circuit diagram of the antenna device shown in FIG. 6. The antenna module 201 preferably includes the coil conductor of the antenna portion 101P, an inductance component L1 by the magnetic material core 40, a resistance component R1, a capacitor C1, and an RFIC of the antenna portion 101P, and the like. The capacitor C1 is a capacitance configured to adjust the resonant frequency of the antenna portion (feeding coil) 101P. The booster coil 301 preferably includes inductance components L2 and L3 of the first coil 1 and the second coil 2, capacitance components C2 and C3 generated between the first coil 1 and the second coil 2, resistance components R2 and R3 of the first coil 1 and the second coil 2, and the like.

As described above, the antenna portion 101P provided on the resin multilayer board may be used as a feeding coil, and the booster coil 301 separate from the resin multilayer board may be used as a booster antenna. By so doing, it is possible to increase a communicable longest distance.

Fourth Preferred Embodiment

Figure 9:
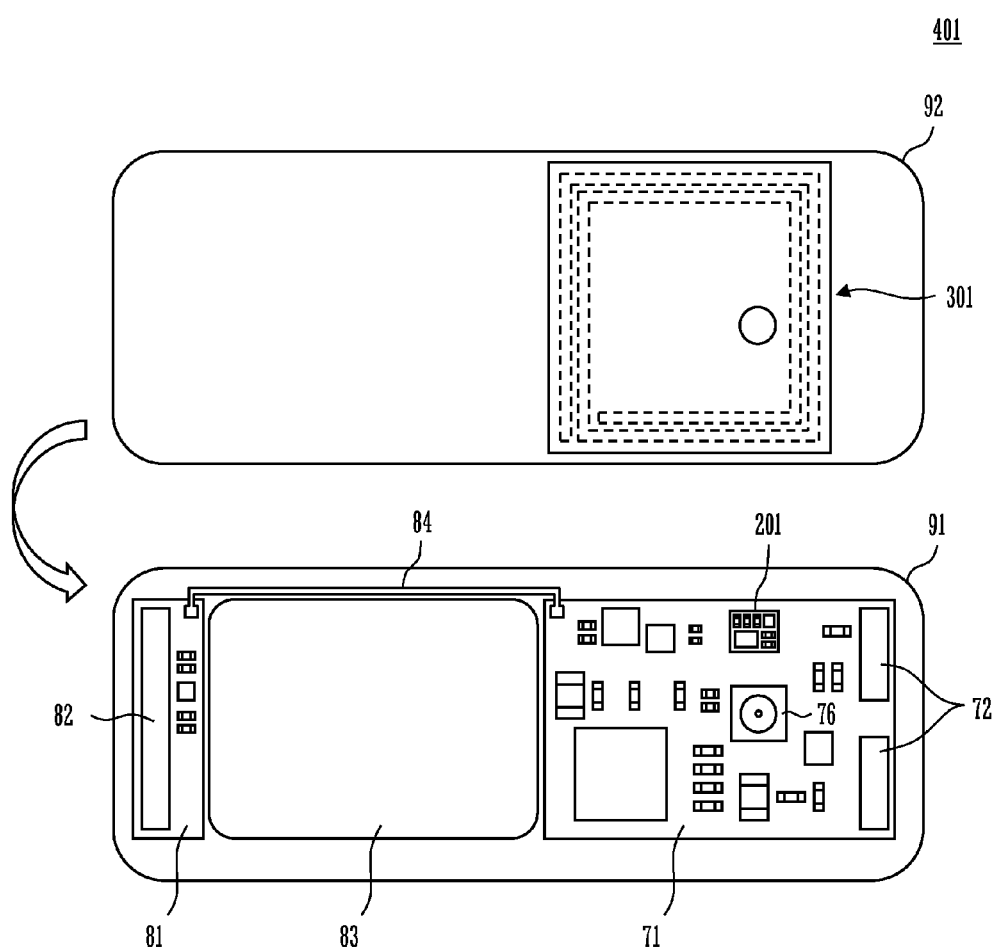
FIG. 9 is a diagram showing the structure of the housing interior of a wireless communication device 401 according to a fourth preferred embodiment of the present invention and is a plan view in a state where a lower housing 91 and an upper housing 92 are separated from each other to expose the interior.
Figure 10:
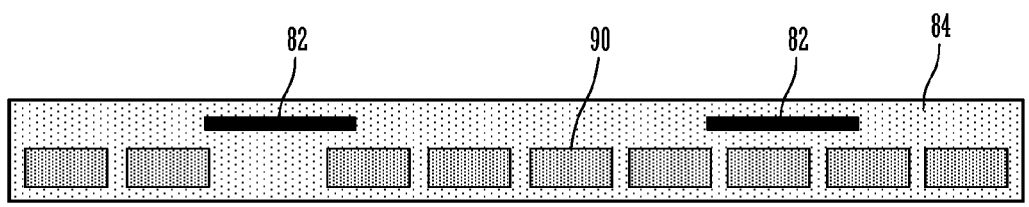
FIG. 10 is a cross-sectional view of an antenna-integrated magnetic sheet disclosed in Japanese Patent No. 4218635.

FIG. 9 is a diagram showing the structure of the housing interior of a wireless communication device 401 according to a preferred embodiment of an electronic device of the present invention, and is a plan view in a state where a lower housing 91 and an upper housing 92 are separated from each other to expose the interior. The wireless communication device 401 includes the antenna module 201 and the booster coil 301 shown in FIG. 6.

Printed wiring boards 71 and 81, a battery pack 83, and the like are housed within the lower housing 91. The antenna module 201 is mounted on the printed wiring board 71. A UHF band antenna 72, a camera module 76, and the like are also mounted on the printed wiring board 71. In addition, a UHF band antenna 82 and the like are mounted on the printed wiring board 81. The printed wiring board 71 and the printed wiring board 81 are connected to each other via a coaxial cable 84.

The booster coil 301 is provided on the inner surface of the upper housing 92. The booster coil 301 is magnetically coupled to the antenna portion (feeding coil) of the antenna module 201.

It should be noted that in FIG. 9, the case of including the booster coil 301 is shown, but the booster coil 301 may not be provided and the antenna module 201 (or the antenna device 101) may be configured so as to be used individually.

Other Preferred Embodiments

In each preferred embodiment of the present invention described above, a case in which the magnetic material core 40 is formed into small pieces during preliminary pressure-ponding has been described, but a plurality of resin sheets may be stacked and the magnetic material core 40 may be formed into small pieces by stress applied to the magnetic material core during full pressure-bonding. In this case as well, the line portions 21 close to the magnetic material core

40 in a stacking direction define and serve as fulcrums and a plurality of cracks are formed in the magnetic material core 40. It should be noted that in this case, the magnetic material core 40 is not formed into small pieces during preliminary pressure-bonding, and thus a small piece of the magnetic material core is prevented from coming off from the resin sheet 12 or being displaced relative to the resin sheet 12.

In addition, in each preferred embodiment described above, a case in which the line portions (conductor pattern) indirectly face the magnetic material core via the resin sheet has been described, but the line portions (conductor pattern) may be disposed so as to directly face the magnetic material core.

Moreover, in each preferred embodiment of the present invention described above, cracks occur in the magnetic material core due to the line portions of the coil conductor for a coil antenna, but the conductor pattern for forming cracks does not need to be a part of the coil conductor for a coil antenna and does not need to be a part of the coil conductor. The conductor pattern may be provided particularly for forming cracks in the magnetic material core.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A manufacturing method for a magnetic material core-embedded resin multilayer board, comprising:
    a preliminary pressure-bonding step of preliminarily pressure-bonding a magnetic material core, which is a sintered body, to at least one resin sheet to form a magnetic material core-equipped resin sheet; and
    a full pressure-bonding step of stacking a plurality of resin sheets including a resin sheet including a conductor pattern formed thereon, a resin sheet including an aperture formed therein, and the magnetic material core-equipped resin sheet, in a state in which the magnetic material core is disposed in a cavity formed by the aperture, and fully pressure-bonding the plurality of resin sheets; wherein
    in the preliminary pressure-bonding step or the full pressure-bonding step, a crack is formed in the magnetic material core along a conductor pattern formed on a resin sheet that directly faces the magnetic material core or on a resin sheet that indirectly faces the magnetic material core via another resin sheet.

2. The manufacturing method for the magnetic material core-embedded resin multilayer board according to claim 1, further comprising a crack positioning step of decreasing a thickness of the magnetic material core at a position where the crack is to be formed, before the preliminary pressure-bonding step or the full pressure-bonding step.

3. The manufacturing method for the magnetic material core-embedded resin multilayer board according to claim 2, wherein the magnetic material core includes a plurality of grooves where cracks are to be formed in the crack positioning step.

4. The manufacturing method for the magnetic material core-embedded resin multilayer board according to claim 3, wherein the conductor pattern includes line portions that define and function as fulcrums during when the magnetic material core is fractured at positions of the plurality of grooves.

5. The manufacturing method for the magnetic material core-embedded resin multilayer board according to claim 1, wherein the conductor pattern includes line portions that define and function as fulcrums during the preliminary pressure-bonding step.

6. The manufacturing method for the magnetic material core-embedded resin multilayer board according to claim 5, wherein the line portions are located on a lower surface of a resin sheet at a position where the magnetic material core overlaps in a plan view.

* * * * *